United States Patent [19]

Zavracky et al.

[11] Patent Number: 4,674,180
[45] Date of Patent: Jun. 23, 1987

[54] METHOD OF MAKING A MICROMECHANICAL ELECTRIC SHUNT

[75] Inventors: Paul M. Zavracky, Norwood; Richard H. Morrison, Jr., Taunton, both of Mass.

[73] Assignee: The Foxboro Company, Foxboro, Mass.

[21] Appl. No.: 606,065

[22] Filed: May 1, 1984

[51] Int. Cl.⁴ .................. H01H 11/00; H01H 11/04
[52] U.S. Cl. ........................ 29/622; 29/885; 156/644; 156/652; 156/656; 427/58
[58] Field of Search ............... 29/622, 885; 427/96, 427/58, 79; 200/181; 430/314; 156/644, 652, 656, 659.1, 661.1

[56] References Cited

U.S. PATENT DOCUMENTS

| | | | |
|---|---|---|---|
| 3,321,602 | 5/1967 | Hazzard | 200/181 |
| 3,413,573 | 11/1968 | Nathanson et al. | 332/31 T |
| 3,509,470 | 4/1970 | Droppa et al. | 200/181 |
| 3,681,134 | 8/1972 | Nathanson et al. | 29/829 |
| 3,686,593 | 8/1972 | Zakaria | 200/181 |
| 4,289,846 | 9/1981 | Parks et al. | 427/96 |

OTHER PUBLICATIONS

Holland, L. & Petersen, K. E., "Bottom Contacting Micromechanical Switching Geometry", IBM Tech. Disclosure Bull., vol. 21, No. 3, Aug. '78, pp. 1207–1208.

Primary Examiner—Percy W. Echols
Attorney, Agent, or Firm—Terrence (Terry) Martin; Jack H. Wu; William E. Meyer

[57] ABSTRACT

A micromechanical electric shunt is fabricated by micromachining according to recent IC fabrication procedures. A plurality of such shunts is incorporated on a single substrate to form novel process station or post identification or signature encoding apparatus for use on a telecommunications bus or the equivalent. Such identification of signature encoding apparatus may be configured for conventional binary coding. Both frequency and current derivative mode apparatus are disclosed.

13 Claims, 21 Drawing Figures

METHOD OF MAKING A MICROMECHANICAL ELECTRIC SHUNT

TECHNICAL FIELD

The present invention relates to the field of microminiature electric shunt devices, especially to such devices exhibiting a hysteresis effect, and more particularly to a plurality of such switches manufactured by microfabrication techniques and combined to provide novel station encoding apparatus.

BACKGROUND ART

Recent developments in microfabrication techniques (also called micromachining), applicable to discrete semiconductors and to integrated circuits (ICs), have brought vast changes to the electronics industries, and have focused attention on smaller, more efficient devices capable of large-scale production at low cost. More particularly, micromachining includes the techniques of planar technology, wet chemical etching and other etching techniques, metallization, and metal deposition. Planar technology includes the various techniques used in integrated circuit fabrication, such as photolithography, oxide etching, thermal diffusion, ion implantation, chemical vapor deposition, and dry plasma etching.

The present inventive concept includes a basic microminiature electrical element and its multiple uses, and the method of manufacture thereof. Micromechanical voltage controlled switches and microsized resonant elements have become known and experimentally tested in certain uses, including as matrix-addressed, optical image storage devices, inexpensive displays, ac signal switching arrays, as reactive (especially inductive and/or tuned) elements, as microrelays, as microsensors, and as microsized switches in microwave stripline circuits.

In the interim, recognition of the need to develop microsensors and photo-optic fiber and microcomponent communications and control techniques in the process control industries has created an unfulfilled need for development of new similar devices in that industry.

For the purposes of this limited description, "process control" includes both individual variable processes and complex processes involving a large number of controlled process conditions such as fluid flow, flow rate, temperature, pressure, level, and the like. "Shunt" is used in describing the present invention in the sense of providing a lower current pathway connecting two points, which points are not necessarily parallel with another current path. "Station" generally refers to a place, site, base, installation, point, locality, terminal, or post. "Hysteresis" is defined as the lagging of a physical effect on a body behind its cause after the causal force is changed in value or removed.

Industrial process control apparatus and techniques have evolved over a number of years from relatively simple individual variable controllers for separate respective process conditions, to very large integrated systems including sophisticated analog and digital processing equipment and sophisticated communications (telemetering) techniques for remotely communicating the process control signals to and from the site of the process control actuator, often a valve, switch, clutch, brake, solenoid, relay, motor, or servomotor or sensor.

The communications/telemetry process may involve (individually or in combination) pneumatic, electric, optical fiber light path, or various other communications media techniques. Converting the communications data to energy to effect change in the process control variable often involves interfacing various energy and communications techniques. Historically, such systems were large and unwieldly and often used substantial amounts of energy.

Micromechanical voltage-controlled switches lacking the hysteresis effect of the present invention and some related circuits are described by Kurt E. Peterson in an article entitled: "Micromechanical Voltage Controlled Switches and Circuits," purportedly published in 1978 (International Business Machines, Corporate Research Division, San Jose, Calif. 95193). Techniques for fabrication of certain configured cantilevered elements superficially similar to the cantilevered portion of the present invention are disclosed in U.S. Pat. No. 3,620,932; in J. B. Angell, S. C. Terry, and P. W. Barth, "Silicon Micromechanical Devices," *Scientific American*, Vol. 248, April 1983, pp. 44–55; K. E. Petersen, "Silicon as a Mechanical Material," *Proc. IEEE*, Vol. 70, No. 5, May 1982, pp. 420–457; and P. W. Barth, "Silicon Sensors Meet Integrated Circuits", CHEMTECH, November 1982, pp. 666–673, all of which are directed to different and inapplicable series of uses. Resonant gate field-effect transistor (RGT) elements are disclosed by Nathanson, et al, in an article entitled: "Tuning Forks Sound a Hopeful Note," *Electronics*, Sept. 20, 1965, pp. 84–87, and in U.S. Pat. No. 3,600,292 of Aug. 17, 1971, for a method of machining and deposition by sputtering, which method was described as being useful in tuning the vibratory members of RGT's. U.S. Pat. No. 3,796,976 to Heng, et al, describes the use of microsized capacitively coupled switches for in-situ tuning of microwave stripline circuits.

DISCLOSURE OF THE INVENTION

The preferred and alternative embodiments of the present invention address the needs for miniature electrical shunts exhibiting hysteresis, and encoding devices of the type made therefrom by the adoption of semiconductor and microfabrication techniques in the manufacture of one or more cantilevered elements in association with a substrate. Combinations of one or more cantilevered elements in an electrical shunt configuration can be configured with other elements to form a digital encoding device suitable for use on multiple wire transmission lines having at least two wires, such as are used in serial digital communication. In another embodiment, the shunt element may be used as a hysteresis element which is capable of oscillation.

The micromechanical shunt of the present invention takes the form of a modified cantilevered beam element fabricated by solid-state microfabrication and micromachining techniques. One or more such metallic cantilevered elements may be joined on a single substrate. The substrate is normally an insulating material such as glass or similar material. The cantilevered beam element is attached at one end and free to move at the other end. Under the free end of the cantilevered element, and attached to the substrate, is an electrical force plate which may be coated with an additional electrical resistance coating and/or a conducting contact plate. Electrical contact is made with the fixed end of the cantilever and with the force plate, and an electrostatic charge applied to the two elements. The free end of the cantilever and the force plate are drawn together by the electrostatic force of the charge applied to the two elements. The force plate is attached to the substrate and the free end of the cantilever is free to move, thus only the cantilever free end is deflected toward the force plate.

By placing an electrical resistance coating on the force plate surface, the cantilever is prevented from making direct electrical contact with the force plate. This is required, since if the cantilever end and force plate were permitted to make direct electrical contact, a short circuit would develop and the electrostatic force bringing the two elements together would be discharged. Thus, the cantilever would separate from the force plate. The micromechanical shunt elements are formed essentially in the following manner: (1) a suitable substrate is prepared, then metallized; (2) the cantilever contact and the force plate areas are photolithed and excess material etched away, then an electrical resistance layer is deposited over the force plate, (3) next, a nickel layer is deposited over the entire surface, which nickel layer becomes bonded to the underlying cantilever contact then a resist layer is deposited, leaving apertures over the cantilever contact and the force plate; (4) the holes are etched through apertures into the nickel, the hole over the cantilever contact going entirely through the nickel to the contact plate, and the hole over the resistance layer extending to a depth short of the resistance layer; (5) a further resist pattern is overlaid, and (6) the cantilever per se is formed by gold plating the nickel layer; (7) finally, the undesired layers, including the nickel layer, are selectively dissolved and/or etched to leave a cantilever beam attached to an electrical contact pad and a force plate, both mounted to a substrate. A plurality of such micromechanical shunts may be prepared by batch processing. A third terminal may be formed subjacent the cantilever beam to serve as the force plate, and the plate underlying the cantilever beam tip may serve as an electrical contact point if desired. A plurality of such cantilever elements may be fabricated surrounding a common force plate.

Incorporating several of these individual devices in an encoding device at a station enables rapid, simple, inexpensive identification of the station, as when a plurality of stations are interrogated on a serial bus.

It is an advantage of the present invention that a microminiature hysteretic shunt element may be formed in large quanities with small size and low cost.

Another advantage of this invention is that many such microminiature shunt devices may be incorporated in a single remote sensor or in each of several other stations as encoding devices to enable identification of such stations in digital bus communication configurations.

Another advantage of this invention is that manufacture by micromachining provides consistent characteristics and enables combination directly with microfabricated sensors for use in process control systems.

Yet another advantage of this invention is flexibility of the device and related signaling apparatus including communications signature systems for encoding information sent to or received from a remote field station sensor. Another advantage is that such signature systems operate on the same two wire lines as the host station or sensor.

Still another advantage of the present invention is that when not active it does not load the source lines. Yet another advantage of the present invention in a signature system configuration is that it may be built to contain no active electronic circuitry.

And finally, another advantage of this invention is that manufacture as an encoding device requires only that one standard programmable microminiature device be manufactured.

Further objects and advantages of the invention are self-evident from the following detailed description of the preferred and alternate embodiments, taken together with the accompanying drawings.

BRIEF DESCRIPTION OF THE DRAWINGS

Numerous features of the invention disclosed herein will be apparent upon examination of the several drawing figures forming a part hereof. In all views, like reference characters indicate corresponding parts.

BEST MODE FOR CARRYING OUT THE INVENTION

Due to the wide range of microfabrication techniques and the many uses to which the micromechanical shunt of the present invention may be put, several specific embodiments of the invention and examples of how they are made are included herein.

Figure 1:
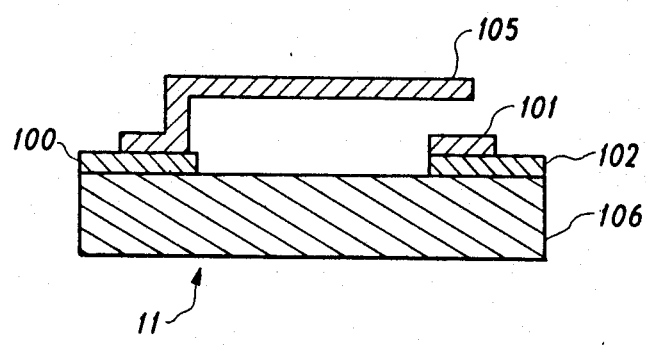
FIG. 1 is a simplified cross-section of a two-terminal cantilever beam shunt element exhibiting hysteresis.
Figure 2:
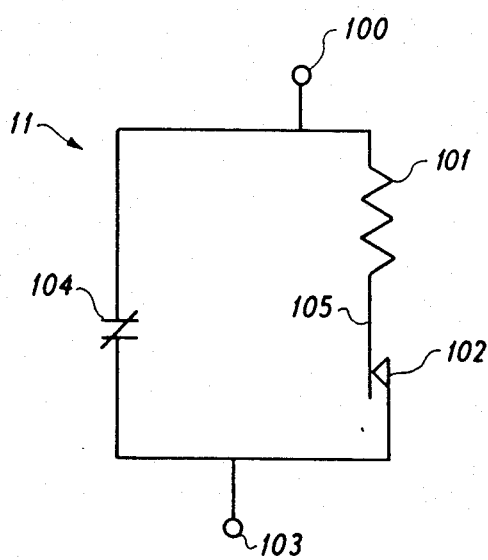
FIG. 2 is a schematic diagram of the two-terminal micromechanical shunt device of FIG. 1, showing the inherent interelectrode capacitance between the cantilever beam and the force plate.

FIG. 1 illustrates pictorially the essential elements of the two-terminal version of the micromechanical shunt 11, while FIG. 2 illustrates the same micromechanical shunt 11 in electrical schematic form. An input terminal 100 is affixed to a substrate 106, and a cantilever beam 105 having a fixed end and a free end is physically and electrically joined to the terminal 100 at its fixed end. Lying under the free end of the cantilever beam 105 is a contact plate 102, which serves as a force plate and also as the output terminal in this example. In operation, a d-c voltage is placed across points 100, 102, and cantilever 105 is electrostatically attracted to the contact plate 102. As cantilever 105 comes closer to plate 102, less voltage is required to move the cantilever into closer proximity with plate 102.

To prevent actual circuit closure between the shunt elements, resistance 101 is interposed between cantilever beam 105 and contact plate 102. A lower charge value is required to maintain the cantilever 105 in close proximity to contact plate 102 than the charge value required to move the cantilever from its rest position into proximity with contact plate 102, thus the shunt 11 exhibits hysteresis. In FIG. 1, the resistance 101 is shown physically located between elements 102, 105, and in FIG. 2, it is shown electrically between cantilever beam 105 and the input terminal 100 for clarity, since it is electrically in series with the input 100, cantilever beam 105, and output 103. An interelectrode capacitance exists between cantilever beam 105 and contact plate 102; it is pictured in FIG. 2 as a variable capacitance 104 because the capacitance value varies in proportion to the spatial relationship between cantilever beam 105 and contact plate 102. Various materials may be used for the physical element described; these materials and substitutes therefore are discussed hereinafter in the discussion disclosing how to fabricate the micromechanical shunt according to the present invention.

Figure 3:
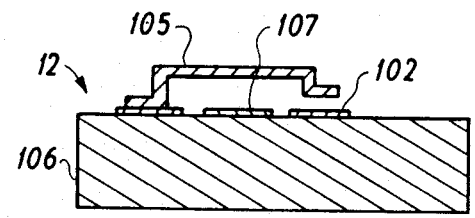
FIG. 3 is a simplified cross-section of a three-terminal cantilever beam shunt element exhibiting hysteresis.
Figure 4:
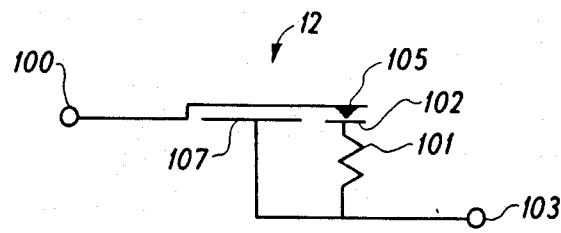
FIG. 4 is a schematic diagram of the micromechanical shunt device of FIG. 3.

FIG. 3 illustrates in pictorial form a three-terminal micromechanical shunt according to the present invention, and FIG. 4 illustrates schematically the same device connected in a two-terminal configuration. In FIG. 3, contact plate 102, cantilever beam 105, and a field plate 107 are separately joined to an insulating substrate 106. In the schematic of FIG. 4, an input terminal 100 is shown connected to the cantilever arm 105, a resistance 101 is connected between cantilever plate 102 and output terminal 103, and the field plate 107, which underlies the cantilever beam 105, is also connected to output terminal 103. An interelectrode capacitance exists between field plate 107 and the cantilever arm 105, but is not shown.

Applying a voltage charge between cantilever beam 105 and field plate 107 draws these two elements together, with a lesser charge being required to maintain or close the gap as the gap is reduced because of the inverse-square electrostatic force-distance relationship. The shunt thereby exhibits hysteresis. A resistance layer may be deposited between contact plate 102 and cantilever beam 105, as in FIG. 1, in order to avoid short-circuiting the voltage charge applied between the field plate 107 and contact plate 102, or a separate discrete resistor may be electrically inserted between contact plate 102 and terminal 103.

Figure 5:
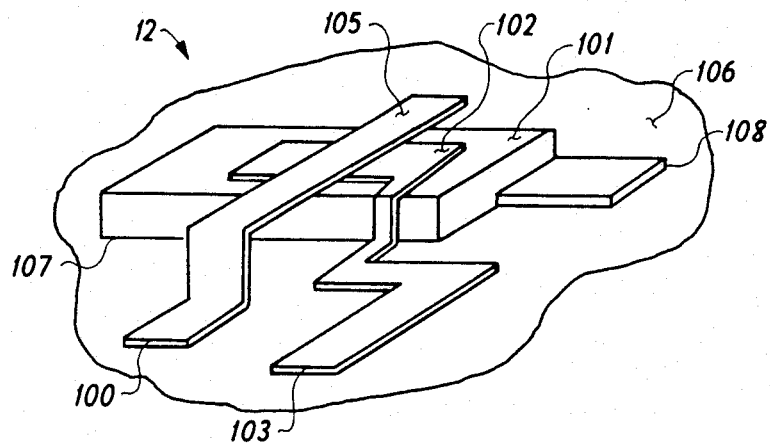
FIG. 5 is a diagrammatic view of another three-terminal cantilever beam shunt element embodiment exhibiting hysteresis.

An alternate embodiment three-terminal shunt 12 is disclosed in FIG. 5, in which a substrate 106 underlies a field plate 107, on which is deposited a resistance layer 101, and on which is in turn mounted a contact plate 102. Cantilever beam 105, having a free end and a fixed end, is attached at its fixed end to the substrate with its free end suprajacent contact plate 102. A field terminal 108 extends from the field plate joined to the substrate 106, and an input terminal 100 extends from the fixed end of cantilever beam 105, also joined to the substrate 106. Another terminal, output terminal 103, is joined to the substrate and to the contact plate 102, generally following the profile of the resistance layer 101 but electrically insulated therefrom.

It must be noted that by wiring the micromechanical shunt as a three-terminal device without a resistance between the cantilever beam 105 and contact plate 102, an electrostatically operable electrical switch is obtained. Such electrical switches exhibit good electrical switching characteristics.

Figure 6:
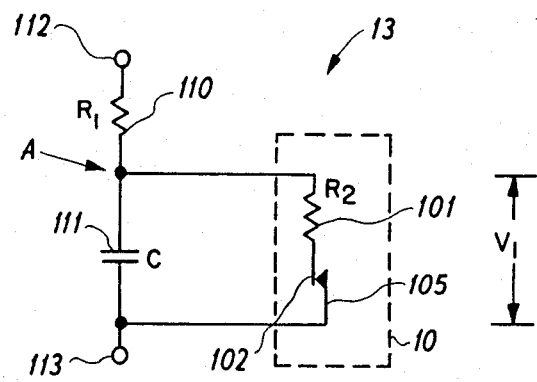
FIG. 6 is a schematic diagram of a basic oscillator employing the hysteretic micromechanical shunt.
Figure 7:
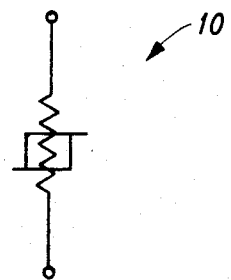
FIG. 7 is a schematic symbol representing the basic cantilever beam shunt element.

Turning now to FIG. 6, micromechanical shunt 10 is shown in a relaxation oscillator circuit 13. Applying a voltage between terminals 112 and 113 to resistor 110 and capacitor 111, which form an RC time constant charging circuit, the capacitor charges with time and the voltage level at voltage divider point A increases relative to terminal 113. The voltage across the micromechanical shunt 10, in parallel with capacitor 111, increases similarly. As the voltage increases, the electrostatic charge between contact plate 102 and cantilever beam 105 brings the two together by electrostatic attraction. When the cantilever beam 105 makes contact, capacitor 111 is discharged through resistance 101. The resistance 101 may be either a discrete resistor or a deposited film electrical resistance between the contact plate 102 and the cantilever beam 105. FIG. 7 represents schematically the micromechanical shunt 10 which includes elements 101, 102, and 105 contained within the dotted line of FIG. 6.

Figure 8:
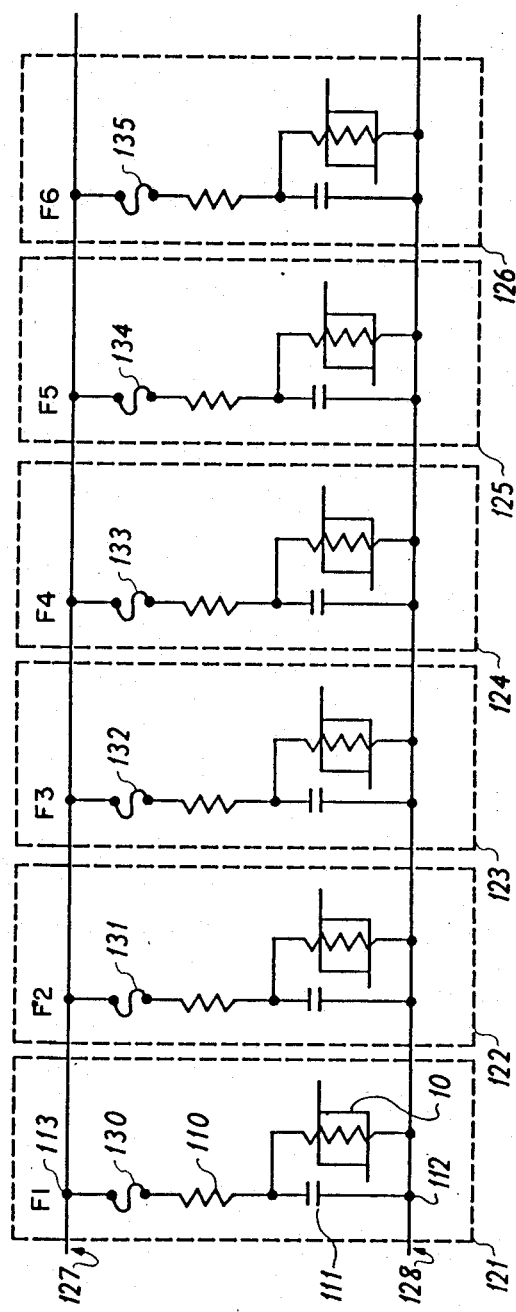
FIG. 8 is a schematic diagram showing a plurality of basic hysteretic shunt oscillators packaged as an encoder for use on a communications bus.

A plurality of these oscillators 121, 122, 123, 124, 125, 126 may be produced together as shown in FIG. 8 and connected in parallel, each being adjusted to a separate frequency. Including a fusible link 103, 131, 132, 133, 134, 135 in series with each respective oscillator section permits arranging a plurality of such oscillators into an oscillator signature system. Except for the addition of its respective fusible link, each oscillator is substantially identical to the oscillator 13 shown in FIG. 6.

Interrupting the power supply line to the oscillator by opening one or more fusible links in a predetermined pattern results in an identifiable encoding pattern. Including a plurality of such fusible link oscillators at a single location or at a single telemetry location, as is facilitated by fabricating several such oscillators on a single chip, enables discrete encoding of the location, function, or station in the telemetry system, which encoding pattern may be remotely sensed or detected. This is especially useful for identifying stations in a high-speed, serial bus telemetry communications configuration.

Figure 9:
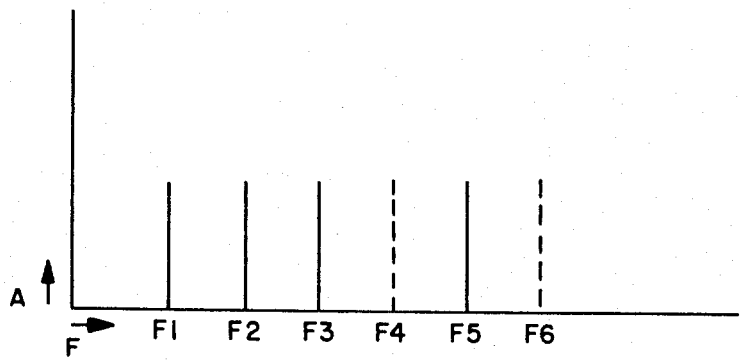
FIG. 9 is a chart showing the distribution of oscillator energy at discrete frequencies, according to the apparatus of FIG. 8.

The presence or absence of a particular frequency value at a station enables conversion to conventional binary coding. Turning now to FIG. 9, there is shown an amplitude versus frequency graph of a station such as that in FIG. 8 in which the fusible links 133, 135 of oscillators 124, 126 are opened and an interrogation voltage applied to communication bus 127, 128 (identified as terminals 1 and 2, respectively). Returned along the bus are frequencies F1, F2, F3, and F5; with F4 and F6 being absent. The presence or absence of energy at each particular frequency is sensed in accordance with conventional spectrum analysis techniques. If the presence of a measurable amplitude of energy at a particular frequency is coded as a binary 1, the station represented in FIG. 9 is coded 111010, and is specifically identifiable from among a plurality of similarly coded stations.

Figure 10:
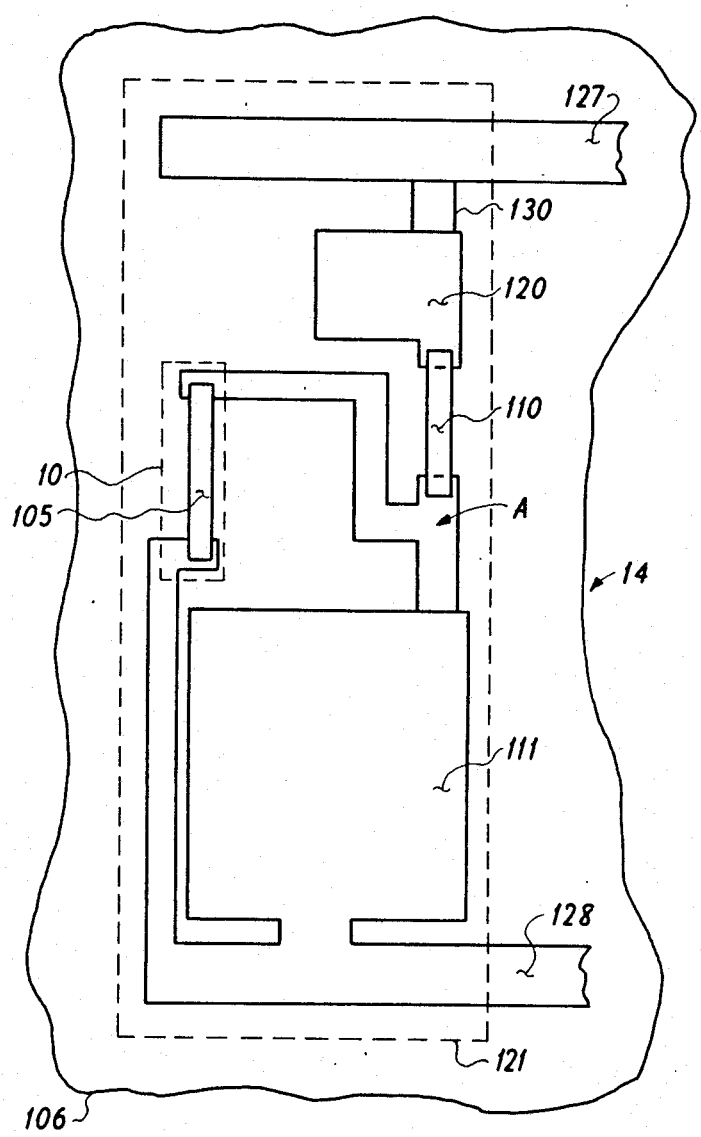
FIG. 10 is a plan view of an enlarged portion of the basic hysteretic shunt oscillator when packaged as an encoder.

In FIG. 10 there is shown a simplified plan view of an individual oscillator section 121 such as forms the basis of an oscillator signature system 14 on a single substrate 106 (remaining oscillator sections, which are identical, are not shown). The micromechanical shunt 10 is connected from ground bus 128 in parallel with capacitor 111 which is in series with both resistor 110 and fusible link 130 to supply bus 127. A pad 120 joins resistance 110 and fusible link 130 and in combination with bus 127 provides a contact area for opening fusible link 130 by passing a high current therethrough. In this manner, the identification encoding can be performed to reflect the coding for a given station or point. A resistance layer (not visible in this view) is ordinarily included underlying the free end of cantilever beam 105 to limit contact current through the cantilever beam to reasonable values. Point A is the voltage divider point described in the discussion associated with FIG. 6.

Figure 12:
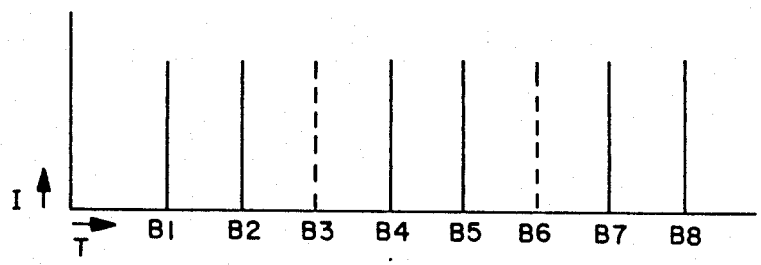
FIG. 12 is a chart showing the second derivative of the electrical current over time resulting from a ramped d-c voltage applied to the communications bus.
Figure 11:
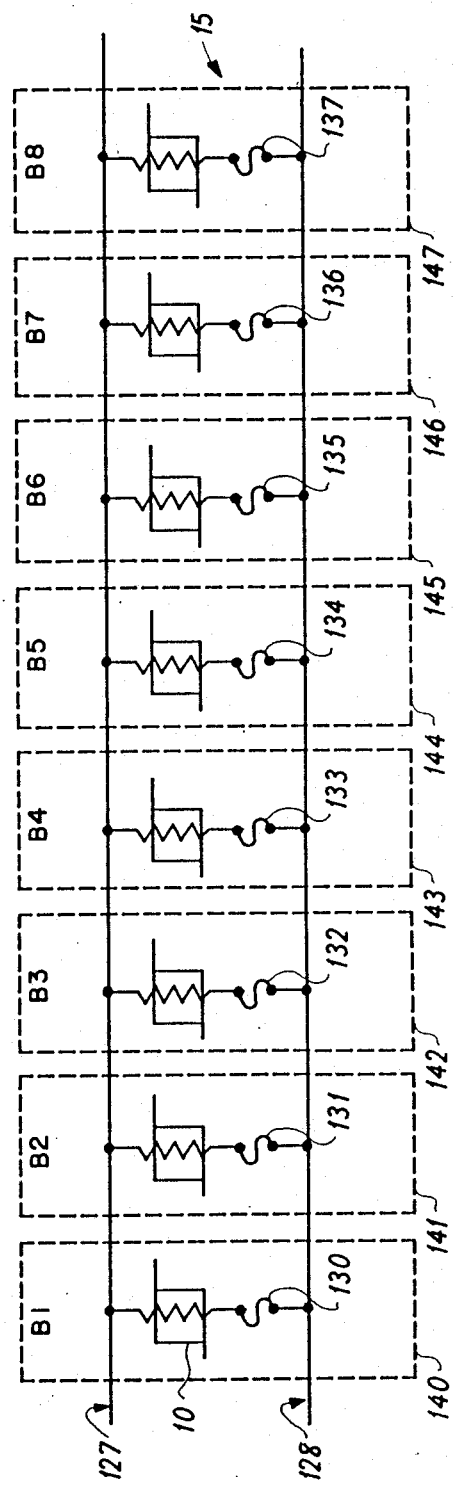
FIG. 11 is a schematic diagram showing a plurality of basic hysteretic shunt elements packaged as a voltage/current encoder for use on a communications bus.

Turning now to FIG. 11, there is shown a series of parallel-connected micromechanical hysteretic shunts 10 similar to those of FIG. 7, each connected with its own respective fusible link 130, 131, 132, 133, 134, 135, 136, 137, and forming an electrical current signature encoding system 15. Each successive micromechanical shunt circuit element 140, 141, 142, 143, 144, 145, 146, 147 has a slightly higher closure threshold voltage, determined mainly by the dimensions of the cantilever beam contained therein. By selectively opening the fusible links, the various shunt elements 140-147 can be removed from the circuit. The shunt closure threshold voltages are selected above the normal operating range of the equipment at the post, station, or operating site. Interrogation is performed by applying a ramped d-c voltage (which includes all of the threshold voltages being interrogated) to communications bus (127, 128 and monitoring the second derivative of the current in the line. In this manner, a series of spikes representative of the coded pattern, is obtained. See FIG. 12, in which bits B1-B8 represent shunt elements 140-147, inclusive. If fusible links 132 and 135 are open, and binary coding is used, FIG. 12 represents a 11011011 8-bit encoding.

Figure 13:
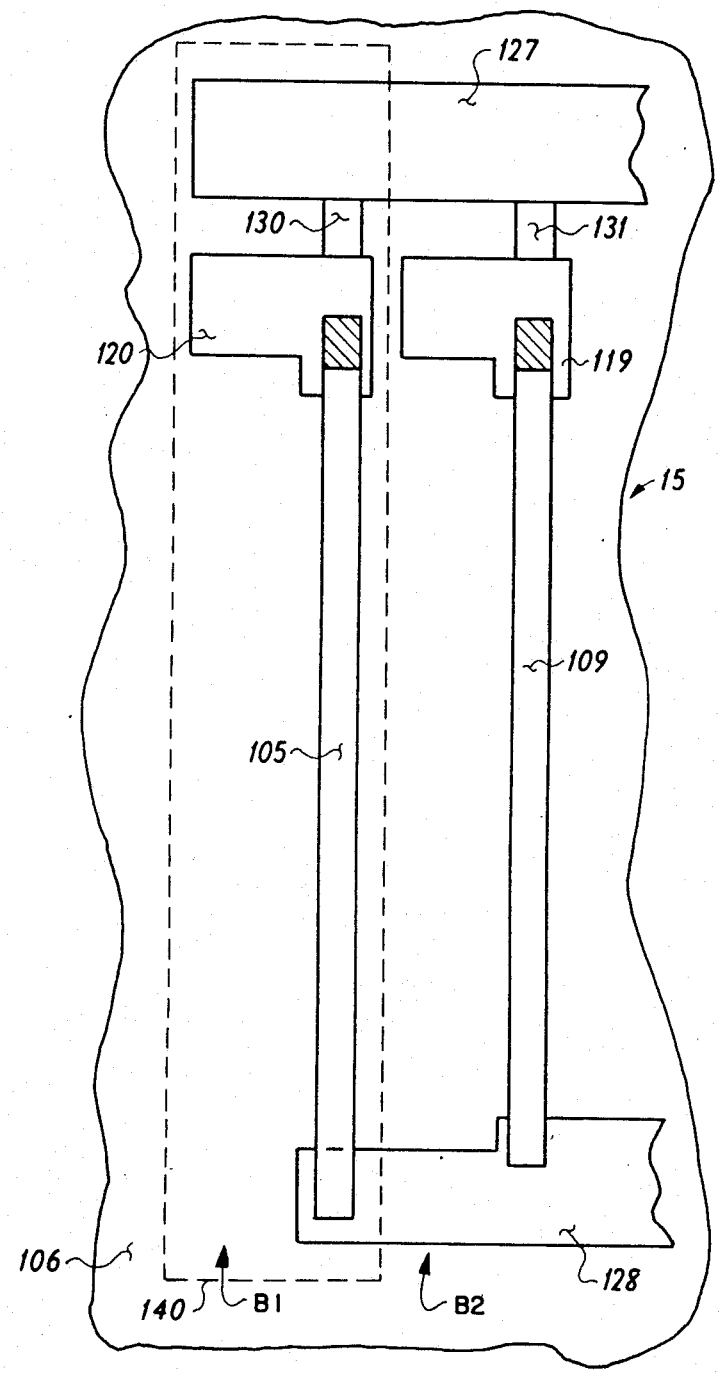
FIG. 13 is a plan view showing two fused micromechanical shunt elements on a single substrate used as a current shunt encoder for use with a communications bus.

A simplified successful layout pattern for the circuit of FIG. 11 is shown in FIG. 13, in which a fused micromechanical shunt 140 having a cantilever beam 105 connected in series with a fusible link 130 is mounted on a substrate 106 between two terminals 127, 128. The cantilever beams 105, 109 are connected with the respective fusible links 130, 131 via fuse pads 120, 119 and are progressively shorter. This variation in length provides one of several ways to vary the threshold voltage of the shunt because longer cantilever beams require lower threshold voltages for closure, all other characteristics being equal. In fabricating these current signature encoding systems 15, the resistance of the individual shunt elements 10 must be selected such that the increment of current produced at shunt activation is detectable above the noise in the current flowing through the host station or site. Consideration must also be given to the threshold voltage separations between each shunt element as limited by the maximum permissible voltage values. Manufacturing capabilities are likely limitations in the differences in threshold voltages between shunts. Vibration immunity is a further consideration.

Referring again for the moment to FIG. 7, the resonant frequency of an oscillating micromechanical shunt may be calculated.

$$V_1 = V_0/\alpha \left(1 - e^{-\frac{\alpha t}{R_1 C}}\right) + V_1(t = \phi) e^{-\frac{\alpha t}{R_1 C}} \quad \text{(Equation 1)}$$

where:
$\alpha = 1$ when the switch is open;
$\alpha = (1 + R_1/R_2)$ when the switch is closed.

The frequency can be calculated by considering the amount of time it takes to raise $V_1$ (or to charge the capacitor) from $V_{off}$ (the voltage at which the switch opens) to $V_{on}$ (the voltage at which the switch closes) and the time it takes to decrease $V_1$ (discharge the capacitor) from $V_{on}$ to $V_{off}$. The sum of these times is the period of oscillation. The inverse sum is therefore the frequency of oscillation. Rewriting Equation 1:

$$V_1 = V_0/\alpha - [V_0/\alpha - V_1(t = \phi)] e^{-\frac{\alpha t}{R_1 C}}$$

where:
$\alpha = 1$ if the switch is open;
$\alpha = (1 + R_1/R_2)$ if the switch is closed.
And inverting gives:

$$t = +\frac{R_1 C}{\alpha} \ln \frac{[V_0/\alpha - V_1(t = \phi)]}{[V_0/\alpha - V_1(t)]} \quad \text{(Equation 2)}$$

where: $t$ = the time for $V_1$ to change between $V_1(\phi)$ and $v_1(t)$.

Therefore, the period of time required to raise the voltage from $V_{off}$ to $V_{on}$ is:

$$t_1 = \frac{R_1 C}{\alpha} \ln \frac{[V_0/\alpha - V_{off}]}{[V_0/\alpha - V_{on}]}$$

where: $\alpha = 1$
and where: $V_1(t=\phi) = V_{off}$, $V_1(t_1) = V_{on}$ was used.

The period of time required to decrease the voltage from $V_{on}$ to $V_{off}$ is:

$$t_2 = \frac{R_1 C}{\alpha} \ln \frac{[V_0/\alpha - V_{on}]}{[V_0/\alpha - V_{off}]}$$

where: $\alpha = 1 + R_1/R_2$
and where: $V_1(t=\phi) = V_{on}$, $V_1(t_2) = V_{off}$ was used.
The period of oscillation is:

$$T = t_1 + t_2,$$

and the frequency of oscillation is:

$$F = \frac{1}{t_1 + t_2} = \frac{1/R_1C}{\ln\left[\dfrac{V_0 - V_{off}}{V_0 - V_{on}}\right] + \ln\left[\dfrac{V_0/\alpha - V_{on}}{V_0/\alpha - V_{off}}\right]}$$

$$F = \frac{1/R_1C}{\ln\left\{\left[\dfrac{V_0 - V_{off}}{V_0 - V_{on}}\right]\left[\dfrac{V_0/\alpha - V_{on}}{V_0/\alpha - V_{off}}\right]\right\}}$$

Note: In order to achieve oscillation with this circuit it is necessary that:

$$\alpha V_O < V_{off} < V_{on}$$

Details for calculating the electrostatic force required to close the micromechanical shunt are included in "Dynamic Micromechanics on Silicon: Techniques and Devices", IEEE Transactions on Electron Devices, Vol. ED-25, No. 10, October 1978, pp. 1241–1250.

Figure 21:
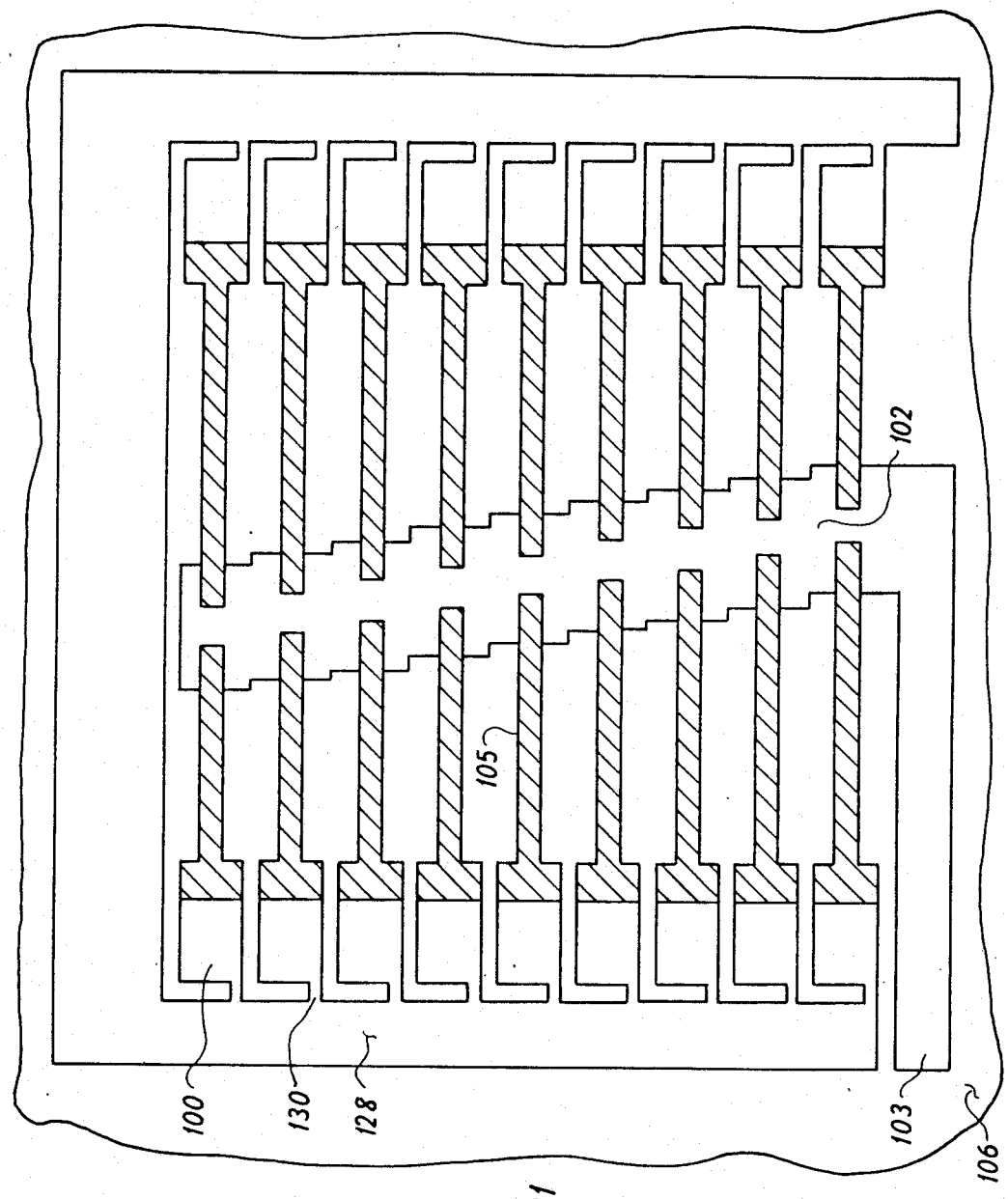
FIG. 21 shows a plan view of a plurality of cantilever beam elements grouped around a unitary force plate element.

FIG. 21 shows a plurality of cantilever beam elements 105 fabricated around a single force plate 102. Each cantilever beam is of a different length. The metallizations are on substrate 106, and include contact terminal 103, electrically connected to force plate 102, a bus 128 connecting the various elements; contact pads 100; fusible links 130 connected between bus 128 and contact pads 100; and the cantilever beams 105.

PROCESSING METHOD

The following is a generalized process for making micromechanical electric shunt devices according to the various embodiments included in this disclosure.

Figure 14:
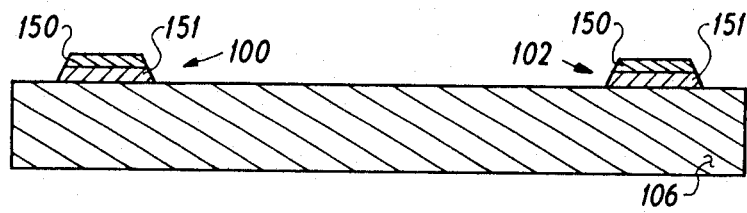
FIG. 14 shows a simplified cross-section of the basic micromechanical shunt device after certain initial fabrication steps.

In FIG. 14, a glass substrate 106 is prepared by washing in detergent solution in an ultrasonic cleaner, rinsed thoroughly in deionized water, then blow-dried with dry nitrogen. A layer of chromium 151, from 10 to 1,000 Angstroms thick is deposited on the glass substrate 106, followed by deposition of a 2,000 to 3,000 Angstrom gold layer. A photolithographic resist layer is applied and prebaked, then exposed to a suitable mask and developed to produce a first, input terminal area 100 and a second terminal surface area 102 which serves as an output terminal area in two-terminal devices 11 and in three-terminal devices 12. In three-terminal shunts 12 a third surface area is formed in an identical manner for a force plate generally lying between first terminal surface area 100 and second terminal surface area 102. The undesired material is etched way in conventional manner to leave the terminal areas. Plasma/sputter etching produces a clean, angled profile and is preferred to wet etching.

Figure 15:
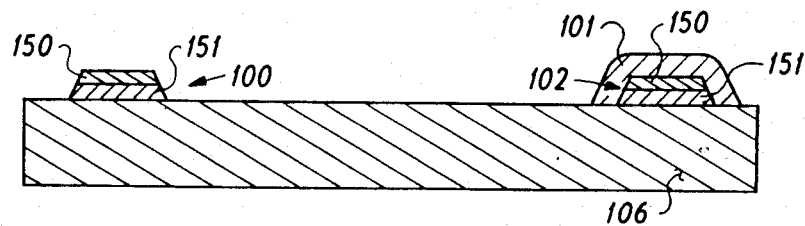
FIG. 15 shows the device of FIG. 14 with a resistance layer covering one terminal.

With terminals 100, 102 etched free, a resistance layer 101 may be desired at terminal 102, especially in two-terminal devices. (See FIG. 15.) Suitable resistive material, such as germanium, a copper oxide, or doped silicon, preferably silicon doped with aluminum, is deposited on terminal 102. In the present embodiment, aluminum-bearing silicon is deposited and the surplus removed by standard photolithographic patterning and etching techniques, preferably by dry etching in order to provide a suitable profile, resulting in resistance layer 101 covering terminal 102.

Figure 16:
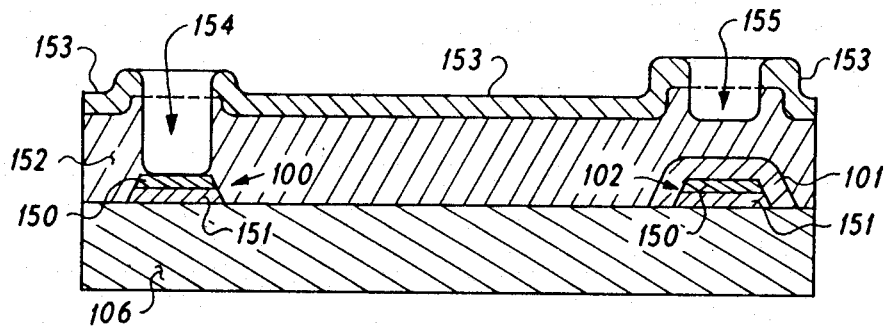
FIG. 16 shows the device of FIG. 15 after certain additional fabrication steps.

Turning now to FIG. 16, there is shown a substrate 106 including thereon terminals 100, 102 and resistance layer 101 according to the preceding procedure. A substantial nickel layer 152 is deposited over the surface of the wafer by sputtering, which layer 152 generally follows the profile of the built-up areas at 100 and 101/102. A nickel layer having a thickness of 1 to 2 microns is desired. Over the nickel layer, a photoresist layer 153 is patterned according to conventional photolithographic methods with etch holes at 154 and 155 precisely aligned over terminals 100 and 102. Holes 154, 155 may be separately etched using separate photolithographic masks and etching steps. A line is used to show the boundary between the nickel layer 152 and photoresist layer 153 before and after the portion of the step where the holes 154, 155 are etched. A cantilever mount hole 154 and a cantilever contact hole 155 are carefully etched; the contact hole 155 is etched to a depth of approximately 3,000 to 10,000 Angstroms and the mount hole 154 is etched to a depth of 1 to 2 microns or until the surface of gold layer 150 of terminal 100 is exposed, so as to provide a plating contact surface for subsequent forming of the cantilever beam. Note that etch resist layer 153 completely covers the nickel layer 152, except for holes 154 and 155.

Figure 17:
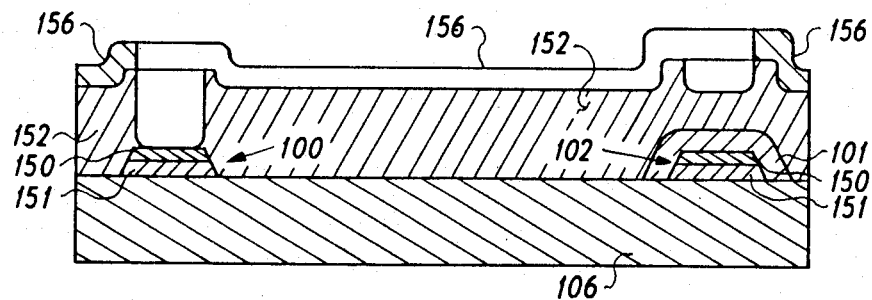
FIG. 17 shows the device of FIG. 16 prepared for plating of the cantilever beam.

In FIG. 17, the hole etch resist pattern has been removed and the desired cantilever plating pattern substituted, using standard photolithographic techniques. Since FIG. 17 is a vertical cross-section along the longitudinal axis of the desired cantilever beam 105 shape, the plating resist layers 156 of the extreme left and right of the figure are shown as cross-sections, while an exposed resist face (boundary for the cantilever beam edge) is shown at the center where the cantilever beam 105 will be formed.

Figure 18:
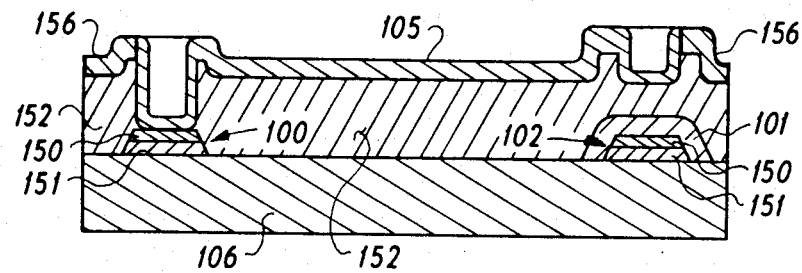
FIG. 18 shows the device including a plated centilever beam.

FIG. 18 shows the deposition of a gold layer onto the nickel layer by plating to a thickness of between 1 and 10 microns in a cantilever beam plating resist channel provided in a beam-defining area to form cantilever 105. The beam 105 may be formed between 5 microns and 1,000 microns wide, preferably between 50 microns and 200 microns wide; between 1 and 10 microns thick, preferably between 2 and 6 microns thick; and of a length between 1 and 200 mils, preferably between 4 and 120 mils, and most preferably between 4 and 30 mils. The exposed nickel is cleaned with a 5 to 10 percent solution of hydrochloric acid and then the beam 105 is formed by plating the exposed nickel surface to the desired thickness with an acid gold solution.

Figure 19:
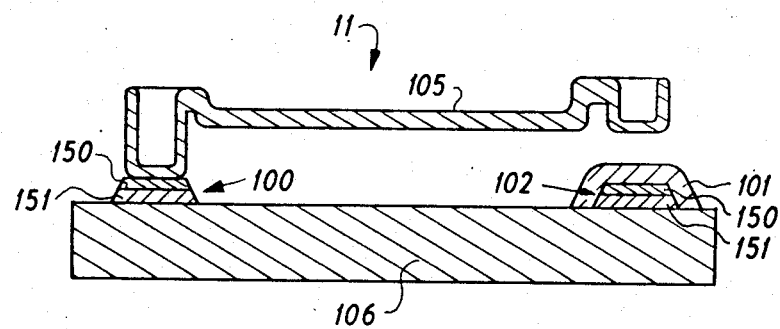
FIG. 19 shows a completed two-terminal shunt in cross section.

The plating resist 156 is removed (FIG. 19) and then the entire nickel layer 152 is removed by etching in a strong solution of nitric acid, thereby relieving cantilever beam 105. Other suitable nickel etchants include combinations of nitric, acetic and sulfuric acids or ferric chloride.

Finally the device is cleaned by placing it in alcohol to lower the surface tension, then immersed in water, and dried; a slightly elevated temperature facilitates drying. Drying of shorter beam lengths may be improved by spinning until dry at relatively low speeds, such as less than 500 rpm.

Figure 20:
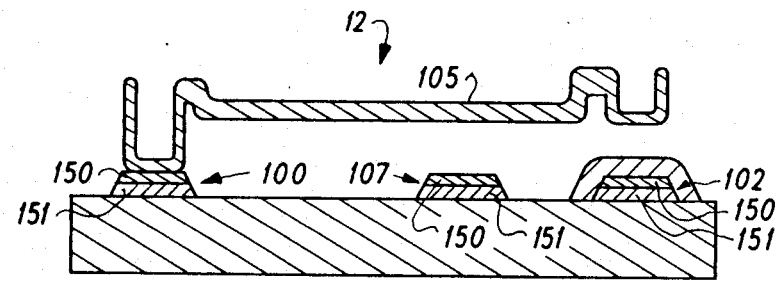
FIG. 20 shows a completed three-terminal shunt in cross section.

FIG. 20 reveals a three-terminal micromechanical shunt 12 formed according to the same process, save for addition of an additional pad surface area 107 as a force plate, and omitting resistance 101 and the process steps associated therewith.

What is claimed is:

1. The method of making a micromechanical electric shunt on a substrate having a planar top surface, comprising the steps of:
    (a) preparing an insulating substrate by cleaning and drying the top surface thereof;

(b) depositing a first metallic covering layer on the top surface of said substrate;

(c) depositing a second metallic layer on the top surface of said first metallic layer;

(d) removing excess of said metallic layers from around two spaced apart areas of said metallic layers to produce a first metallic terminal and a second metallic terminal, by etching;

(e) depositing a removable third metallic layer over the top surface of said substrate, including said first terminal and said second terminal;

(f) etching a first hole through said third metallic layer to said first terminal and etching a second hole into said third metallic layer to form a surface within said third metallic layer and which is separated from said second terminal;

(g) providing an elongated cantilever beam plating surface resist pattern around and between said first and second holes on said third metallic layer;

(h) depositing a fourth metallic layer on said third metallic layer within said cantilever beam plating surface pattern to form a cantilever beam;

(i) removing said resist pattern;

(j) relieving said cantilever beam by removal of the entire third metallic layer; and (k) cleaning the micromechanical electric shunt.

2. The method of claim 1, wherein said substrate is glass.

3. The method of claim 1, wherein said first metallic layer is chromium.

4. The method of claim 1, wherein said second metallic layer is gold.

5. The method of claim 4, wherein said second metallic layer is between 2,000 and 3,000 Angstroms thick.

6. The method of claim 1, wherein said third metallic layer is nickel.

7. The method of claim 6, wherein said third metallic layer is between 1 and 2 microns thick.

8. The method of claim 1, further including the step of depositing an electrical resistance layer on said second terminal last before step (e).

9. The method of claim 8, wherein said electrical resistance layer is selected from the group consisting of germanium, copper, an oxide of copper, silicon, or aluminum-bearing silicon.

10. The method of claim 1, further including forming in step (d) a force-plate terminal between said first and second metallic terminals.

11. The method of claim 1, further including additional repetitions of steps (a) through (k) to form a plurality of micromechanical electric shunts on a single substrate.

12. The method of claim 1, further including the additional process steps of:

forming first and second elongated, spaced apart, unconnected electrical contact buses, one of said buses including one of said first and second metallic terminals; forming a fusible link between the other of said buses and the other of said first and second metallic terminals; enlarging the other of said first and second metallic layers to form an expanded contact area.

13. The method of claim 1, further including the additional process steps of:

forming a capacitor electrically connected to and parallel with said micromechanical electrical shunt, and forming a resistor electrically connected in series with said capacitor and shunt combination.

* * * * *